United States Patent
Van Uden et al.

(10) Patent No.: US 10,638,612 B2
(45) Date of Patent: Apr. 28, 2020

(54) CARRIER FOR SOLID-STATE LIGHTING DEVICES INTENDED FOR A LIGHT BULB

(71) Applicant: PHILIPS LIGHTING HOLDING B.V., Eindhoven (NL)

(72) Inventors: Martijn Jochem Van Uden, Eindhoven (NL); René Theodorus Wegh, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/580,285

(22) PCT Filed: Jun. 8, 2016

(86) PCT No.: PCT/EP2016/062982
§ 371 (c)(1),
(2) Date: Dec. 7, 2017

(87) PCT Pub. No.: WO2016/198431
PCT Pub. Date: Dec. 15, 2016

(65) Prior Publication Data
US 2018/0168047 A1    Jun. 14, 2018

(30) Foreign Application Priority Data
Jun. 11, 2015    (EP) .................................... 15171556

(51) Int. Cl.
| F21K 9/232 | (2016.01) |
| H05K 1/18 | (2006.01) |
| F21K 9/90 | (2016.01) |
| F21V 21/14 | (2006.01) |
| F21Y 115/10 | (2016.01) |
| F21Y 107/00 | (2016.01) |

(Continued)

(52) U.S. Cl.
CPC ............. *H05K 1/189* (2013.01); *F21K 9/232* (2016.08); *F21K 9/90* (2013.01); *F21V 21/14* (2013.01);
(Continued)

(58) Field of Classification Search
CPC .................... H05K 1/189; H05K 1/58; H05K 2201/09063; H05K 2201/055;
(Continued)

(56) References Cited

U.S. PATENT DOCUMENTS 8,079,735 B1 *  12/2011  Vakil ......................... F21V 3/00
                                                               362/235
8,167,677 B2   5/2012  Huang
(Continued)

FOREIGN PATENT DOCUMENTS

CA          2428723 A1    11/2004
JP        2011523180 A     8/2011
(Continued)

*Primary Examiner* — William J Carter
*Assistant Examiner* — Omar Rojas Cadima
(74) *Attorney, Agent, or Firm* — Akarsh P. Belagodu

(57) ABSTRACT

There is provided a carrier (6) for solid-state lighting devices (2). The carrier (6) is intended to be arranged in a light bulb and is formed from one single flat and formable substrate (1), which has been bent to a generally tube-shaped form. The carrier (6) includes: an annular mounting portion (4) for mounting the carrier (6) inside the light bulb; and two or more strips (5) extending generally parallel to each other from the annular mounting portion (4) and being separated from each other in a tangential direction of the annular mounting portion (4). Each strip (5) has one or more electrically conducting paths (3) and a solid-state lighting device (2) mounted thereon. There is also provided a method for producing a tube-shaped carrier (6). The strips are easy to shape by bending, twisting and/or folding, resulting in a significant freedom in the positioning of the SSL devices.

20 Claims, 8 Drawing Sheets

(52) U.S. Cl.
CPC ....... *F21Y 2107/00* (2016.08); *F21Y 2115/10* (2016.08); *H05K 2201/051* (2013.01); *H05K 2201/053* (2013.01); *H05K 2201/055* (2013.01); *H05K 2201/09063* (2013.01); *H05K 2201/10106* (2013.01)

(58) Field of Classification Search
CPC ... H05K 2201/053; H05K 2201/10106; H05K 2201/051; H05K 2201/60; F21V 21/14; F21V 31/00; F21K 9/90; F21K 9/10; F21K 9/1355; F21K 9/232; F21Y 2107/00; F21Y 2115/10; H01L 23/34; H01L 23/58
USPC .................... 362/249.01, 223, 264, 267, 367
See application file for complete search history.

(56) References Cited

U.S. PATENT DOCUMENTS

| | | | |
|---|---|---|---|
| 2009/0302730 A1* | 12/2009 | Carroll | F21V 3/02 313/46 |
| 2011/0163675 A1* | 7/2011 | Lin | F21V 3/00 315/113 |
| 2011/0222286 A1* | 9/2011 | Oba | G01N 21/8806 362/249.04 |
| 2012/0169251 A1* | 7/2012 | Lai | F21K 9/90 315/294 |
| 2012/0170288 A1* | 7/2012 | Lai | F21K 9/90 362/373 |
| 2013/0250585 A1 | 9/2013 | Le Toquin et al. | |
| 2013/0271989 A1 | 10/2013 | Hussell et al. | |
| 2014/0049972 A1 | 2/2014 | McGuire et al. | |
| 2014/0268826 A1 | 9/2014 | Pickard et al. | |
| 2015/0252956 A1* | 9/2015 | Carroll | F21K 9/90 362/249.04 |
| 2018/0100624 A1* | 4/2018 | Bergenek | H05K 1/189 |

FOREIGN PATENT DOCUMENTS

| | | |
|---|---|---|
| JP | 2011253782 A | 12/2011 |
| JP | 2015502021 A | 1/2015 |
| WO | 2012115884 A1 | 8/2012 |
| WO | WO2013078180 A1 | 5/2013 |
| WO | WO2013124601 A1 | 8/2013 |
| WO | WO2014080301 A1 | 5/2014 |
| WO | 2015039999 A1 | 3/2015 |

* cited by examiner

CARRIER FOR SOLID-STATE LIGHTING DEVICES INTENDED FOR A LIGHT BULB

CROSS-REFERENCE TO PRIOR APPLICATIONS

This application is the U.S. National Phase application under 35 U.S.C. § 371 of International Application No. PCT/EP2016/062982, filed on Jun. 8, 2016, which claims the benefit of European Patent Application No. 15171556.2, filed on Jun. 11, 2015. These applications are hereby incorporated by reference herein.

TECHNICAL FIELD

This invention relates to a carrier for solid-state lighting (SSL) devices intended for a light bulb and to a method for producing such a carrier.

BACKGROUND

There is currently a strong trend to replace conventional incandescent light bulbs with light bulbs based on SSL technology since these typically have superior performance with respect to energy efficiency, operational lifetime and many other factors. An example of such a light bulb is disclosed in WO 2014/080301 A1. This document discloses a lighting device that has light-emitting diodes (LEDs) mounted on small tabs of a sheet made of a heat-conducting material inside a housing.

Examples of the technical considerations that must be addressed when making a light bulb based on SSL technology include how to efficiently cool the SSL devices and how to achieve a light distribution that meets the requirements of the intended application. Further efforts aimed at finding innovative solutions to these technical challenges are warranted.

US 2014/0049972 discloses a cylinder-shaped lighting device in which the envelope comprises a flexible substrate provided with LEDs. The cylinder-shaped envelope is mounted on a base for establishing the electrical and mechanical connection with a socket.

WO 2013/078180 discloses a flexible substrate comprising LEDs for use in a lighting device, for instance in retrofit bulbs.

SUMMARY

It would be advantageous to provide an improved or alternative carrier for SSL devices intended for a light bulb. Aspects of particular interest include whether the carrier improves the thermal performance of the light bulb and whether the carrier facilitates the meeting of different light distribution requirements.

In a first aspect, there is presented a carrier for SSL devices. The carrier is intended to be arranged in a light bulb and is formed from one single flat and formable substrate which has been bent to a generally tube-shaped form. The carrier includes an annular mounting portion for mounting the carrier inside the light bulb and two or more strips which extend generally parallel to each other from the annular mounting portion and are separated from each other in a tangential direction of the annular mounting portion. Each strip has a length in a direction away from the mounting portion and a width in the tangential direction where the strip is joined to the mounting portion. The length is at least two times larger than the width. Further, each strip has one or more electrically conducting paths extending along the strips from the mounting portion to a designated mounting site for an SSL device, and an SSL device mounted on each mounting site.

The strips will extend from the annular mounting portion to form an extended crown-like form. The tube-shaped form of the carrier will enable gas inside the light bulb to flow easily, something which may give rise to a thermal chimney effect. This improves the transfer of heat generated by the SSL devices to the outside of the light bulb. Moreover, the strips are easy to shape by bending, twisting and/or folding, resulting in a significant freedom in the positioning of the SSL devices and in choosing the directions in which they emit light. The carrier therefore facilitates the provision of the best light distribution for the intended application.

In one embodiment, the length is at least three times larger than the width, alternatively at least four times larger or five times larger. Increasing the length of the strips may increase the thermal chimney effect. The optimal length depends on factors such as the shape and size of the light bulb in which the carrier is arranged as well as the desired light distribution.

In one embodiment, at least two of the strips have different lengths. Such strips may facilitate the meeting of some light distribution requirements.

In one embodiment, at least one strip has a proximal portion adjacent to the mounting portion and a distal portion at a distance from the mounting portion. The distal portion is wider than the proximal portion. The increased width makes it easier to mount several SSL devices on the strip. All, or half, of the strips may have this shape, for instance.

In one embodiment, at least one strip has a distal portion at a distance from the mounting portion, which distal portion has a V-shaped cross section when viewed in a tangential direction. All, or half, of the strips may have a distal portion with a V-shaped cross section, for instance. When two SSL devices are mounted on different "legs" of the same V they will emit light in different directions.

In one embodiment, at least one strip has at least one SSL device mounted on each of two opposite sides, i.e. on a side facing into the tube-shaped carrier and on a side facing out from the tube-shaped carrier. Mounting SSL devices in this way results in some of the SSL devices emitting light towards the outside of the carrier while others emit light towards the inside of the carrier. This may create a wide distribution of light.

Instead of mounting LEDs on two sides of a strip, a longer strip with LEDs on one side may be double-folded. Thereby, some of the SSL devices may be directed towards the inside of the carrier and some of the SSL devices may be directed towards the outside.

In one embodiment, the carrier has at least one fastening strip extending from the mounting portion. Such fastening strips may be used to mechanically fix the carrier inside a light bulb.

In one embodiment, the mounting portion comprises a plurality of holes in the radial direction. The holes go completely through the mounting portion and help prevent heat being transferred to the SSL devices during production of the light bulb, especially when the envelope of the light bulb is sealed.

In a second aspect, there is presented a light bulb which comprises: a cap for mechanically and electrically connecting the light bulb to a lamp socket; a light-transmissive envelope attached to the cap; a stem arranged inside the envelope and proximal to the cap; and a carrier according to any of the preceding claims, wherein the mounting portion at least partly surrounds the stem and the strips extend into the envelope. Two or more SSL devices are mounted on the carrier. The effects and features of this second aspect are similar to those described above in connection with the first aspect.

In one embodiment, the light bulb is a gas-filled light bulb. The gas, for example helium, may improve thermal performance by giving better heat transfer from the SSL devices to the envelope. The light bulb may contain a mix of gases, for example a mix of helium and oxygen. Using a mix of gases may improve the lifetime of the light bulb by reducing lumen depreciation of the SSL devices.

In a third aspect, there is presented a method for producing a carrier for SSL devices, which carrier is intended to be arranged in a light bulb. The method comprises: providing a flat formable substrate having two or more SSL devices; cutting the substrate into a shape having a substantially rectangular mounting portion and two or more strips extending generally parallel to each other from one side of the mounting portion in a direction away from the mounting portion and being separated from each other in a lengthwise direction of the mounting portion, each strip having a length in the direction away from the mounting portion and a width in the lengthwise direction where the strip is joined to the mounting portion, the length being least two times larger than said width; and forming the mounting portion into an annular shape, to form a substantially tube-shaped carrier. The effects and features of this third aspect are similar to those described above in connection with the first aspect.

In one embodiment, the method further comprises bending, twisting and/or folding at least one strip. By bending, twisting and folding the strips it is possible to direct the SSL devices so as to achieve a desired light distribution.

It is noted that the invention relates to all possible combinations of features recited in the claims.

BRIEF DESCRIPTION OF THE DRAWINGS

This and other aspects of the present invention will now be described in more detail with reference to the appended drawings in which.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

An example of a method for manufacturing a tube-shaped carrier for SSL devices will be described with reference to FIGS. 1 and 2a to 2d. The carrier and SSL devices together form a three-dimensional L2 structure. The carrier may be intended for an A60 light bulb, for instance.

In step S1, a flat formable substrate 1 is provided. The substrate 1 may for example be a substrate for printed electronics, a flexible printed circuit board (FPCB) or a bendable metal core printed circuit board (MCPCB).

Figure 1:
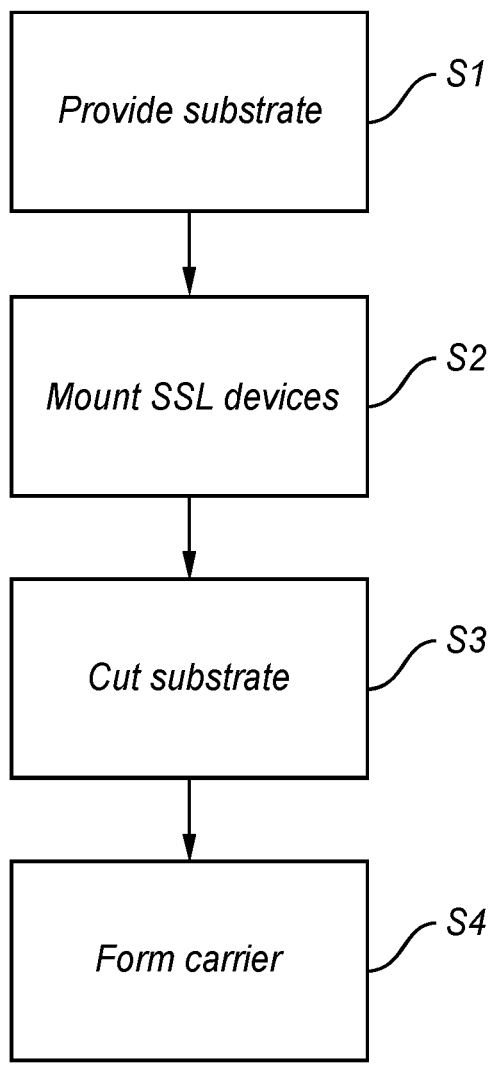
FIG. 1 is a flowchart of some of the steps of a method for producing a carrier.
Figure 2A:
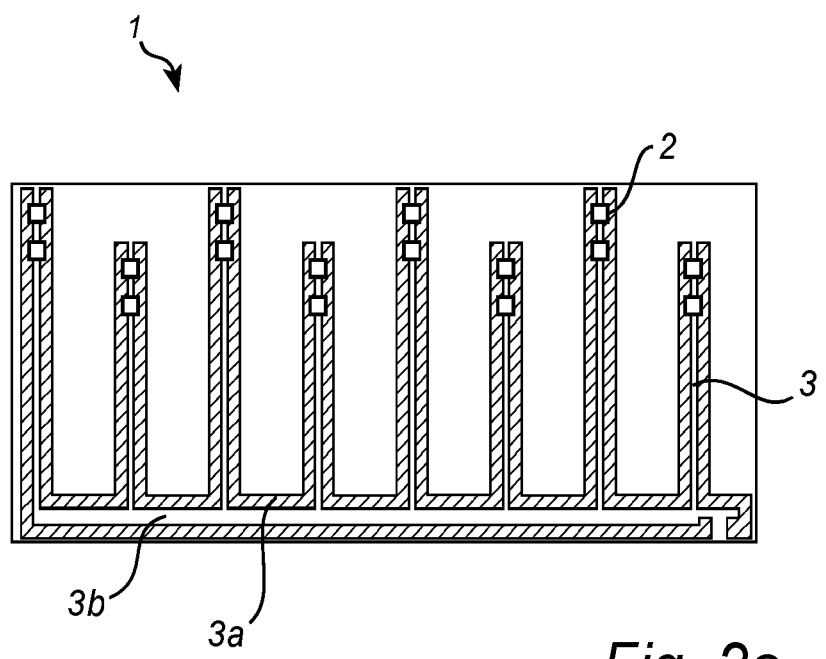
FIGS. 2a to 2d schematically illustrates some of the steps of the flowchart in FIG. 1.

In step S2, several SSL devices 2 are mounted on the substrate 1 at designated mounting sites (see FIG. 2a). The SSL devices 2 can for example be semiconductor LEDs, organic LEDs, polymer LEDs, or laser diodes. All of the SSL devices 2 may be configured to emit light of the same color, for example white light. Alternatively, different SSL devices 2 may be configured to emit light of different colors. The SSL devices 2 are electrically connected to electrical paths 3a on the substrate 1 which also has isolation paths 3b. The electrical paths 3a are typically formed by a conductive material printed on the substrate 1, but they may have been arranged on the substrate 1 in some in some other way, for example by etching. A positive terminal 3a' and a negative terminal 3a" are formed by the ends of the electrical paths 3a.

Figure 2B:
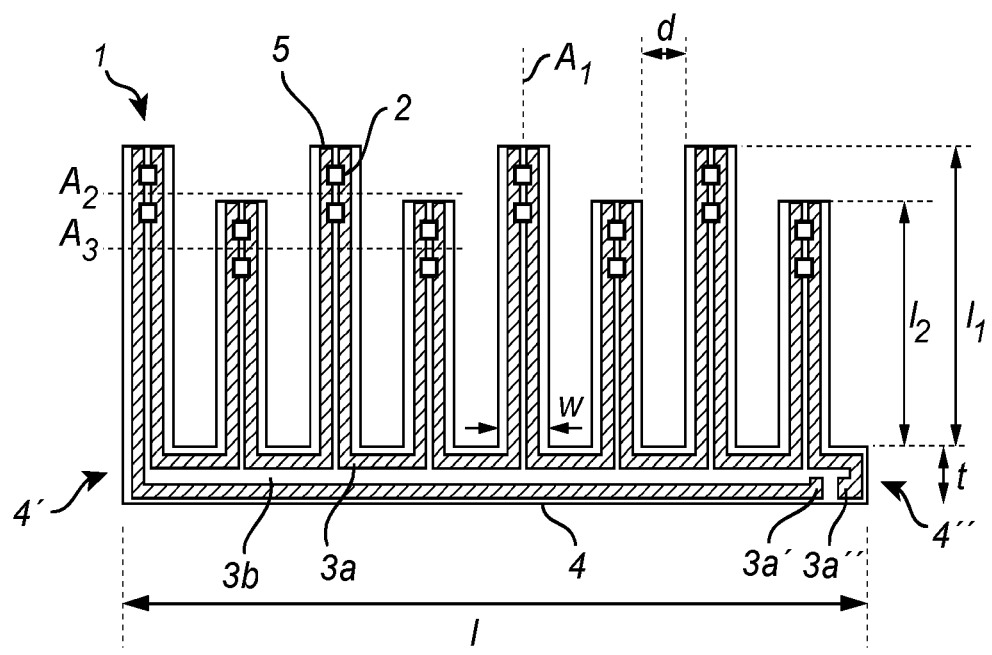

In step S3, the substrate 1 is cut into a shape having a mounting portion 4 and two or more strips 5. The cut substrate 1 is illustrated in FIG. 2b. It should be noted the SSL devices 2 may be mounted on the substrate 1 before or after the substrate 1 is cut, i.e. the step S2 may precede or follow the step S3. Cutting the substrate 1 may for example comprise stamping, laser cutting or milling. The best way of cutting the substrate 1 depends on the type of substrate 1. Stamping or laser cutting is often used to cut FPCBs, and bendable MCPCB are often cut by milling or stamping. There can be an even or odd number of strips 5, the number typically being no more than 10. The mounting portion 4 is substantially rectangular. The length 1 and the width t of the mounting portion 4 are both chosen to suit the design requirements associated with the light bulb for which the carrier is intended. The length 1 may for example be approximately 7 cm, and the width t may for example be in the range from 3 mm to 10 mm. The strips 5 extend from one side of the mounting portion 4 and are separated by a distance d in the lengthwise direction of the mounting portion 4. The distance d may be in the range from 0.1 mm to 10 mm. In the example shown in FIG. 2b, the distance d is the same between all of the strips 5, but this may or may not be the case in other embodiments. Each strip 5 has a width w where the strip 5 is joined to the mounting portion 4, and the strips 5 have this width all along their lengths. The strips 5 thus have a constant width w. In other examples, the width where the strips 5 are joined to the mounting portion may differ between strips 5 and/or the width of the strips 5 may not be constant. Half of the strips 5 have a first length $l_1$ and the other half have a second length $l_2$, which is shorter than the first length $l_1$. The first and second lengths $l_1$, $l_2$ are both at least two times larger than the width w. The short and long strips 5 are the alternately arranged. Of course, many other configurations of strip lengths are possible. All of the strips 5 may for example have the same length in another embodiment, i.e. the first length $l_1$ may be equal to the second length $l_2$ (as is illustrated in FIG. 2d). The most suitable values of the width w and the first and second lengths $l_1$, $l_2$ depend on the application. The width w is typically in the range from 3 mm to 10 mm. If the carrier 6 is intended for an A60 light bulb, the first length $l_1$ may for example be approximately 8 cm. The second length $l_2$ may for example be from about 1 cm to about equal to $l_1$.

The substrate 1 is cut so that there are two SSL devices 2 on each strip 5. In other examples, there may be one or more than two SSL devices 2 on each strip 5, and different strips 5 may have different numbers of SSL devices 2. The SSL devices 2 may be mounted anywhere on the strips 5, and the positions of the SSL devices 2 on the strips 5 may differ between strips 5. The two SSL devices 2 are separated along the length of the strips 5 and mounted close to the ends of the strips that are distal to the mounting portion 4. Only one of the two opposite sides of the substrate 1 has SSL devices 2, but both sides of the substrate 1 may have SSL devices 2 in other examples where the substrate 1 is a doubled-sided printed circuit board.

In step S4, the mounting portion 4 is formed into an annular shape. This may be achieved by bending the substrate so that the two opposite ends 4', 4" of the mounting portion 4 meet and then attaching the ends 4', 4" to each other. There may for example be a hook on one of the ends 4', 4" and a hole or similar on the other for receiving the hook. The mounting portion 4 has a circular shape as seen along the central axis $A_4$ but may have a different shape in other examples. The shape of the mounting portion 4 as seen along the central axis $A_4$ can for example be polygonal, such as rectangular, hexagonal or octagonal. It should be noted that some substrates 1 may be stiff enough to stay bent by themselves so that it is not necessary to attach the ends 4', 4" of the mounting portion 4 to each other. If so, the mounting portion 4 may have a C-like shape when viewed along the central axis $A_4$. Attaching the ends 4', 4" together may result in the annular shape of the carrier being better maintained over time though.

Figure 2C:
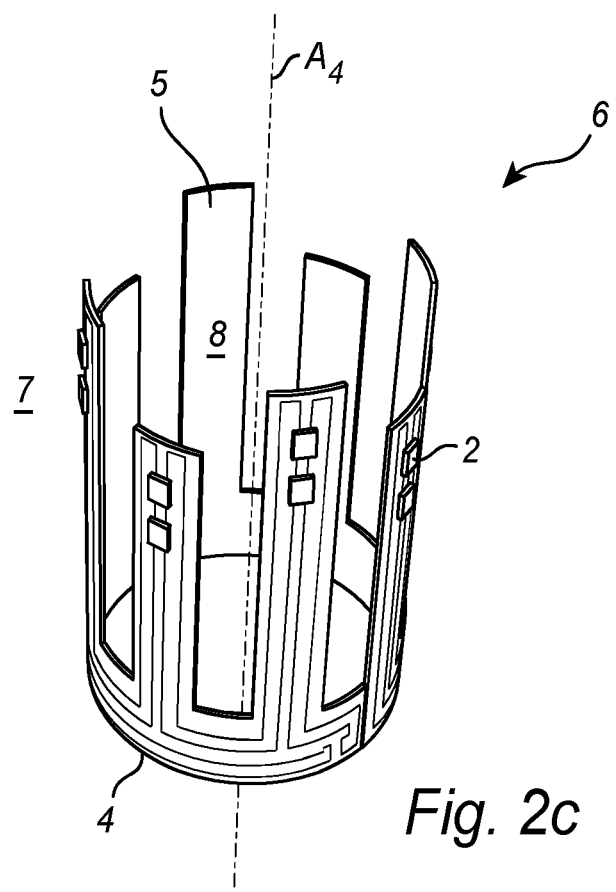
Figure 2D:
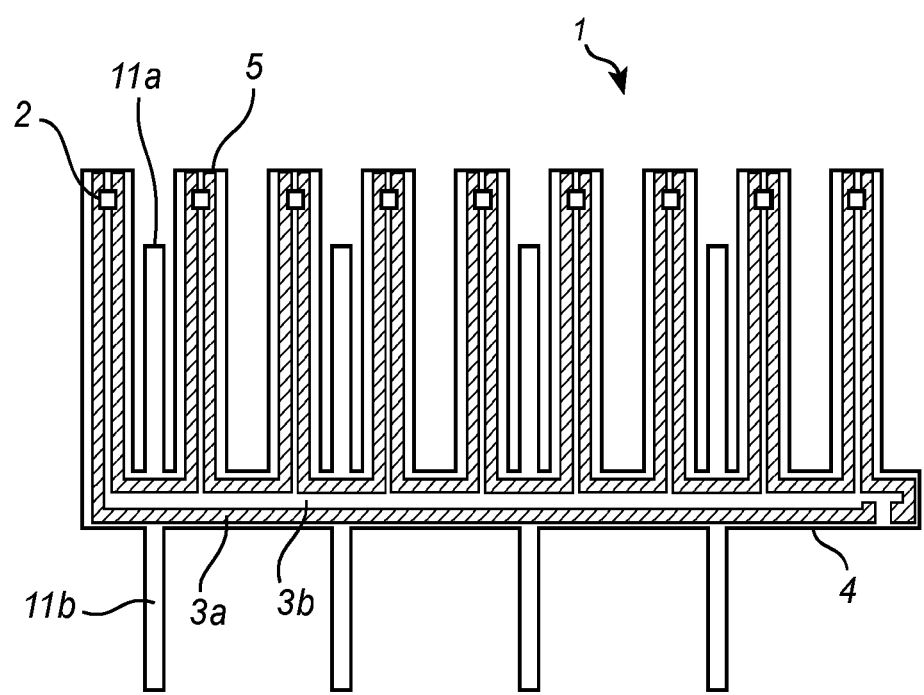
Figure 3:
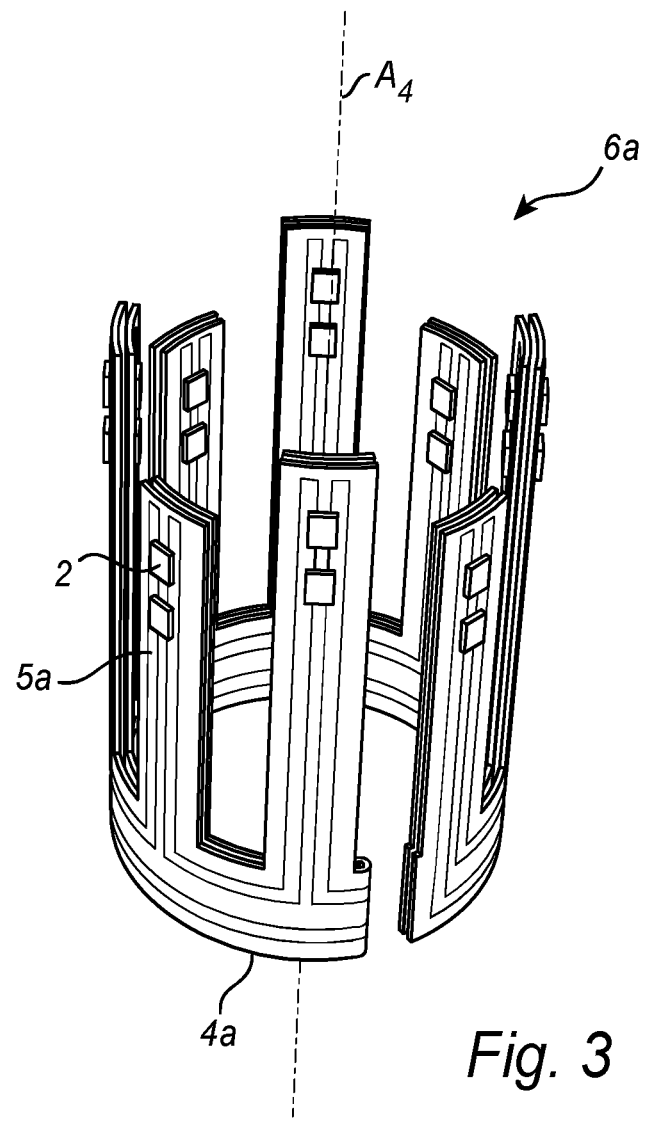
FIGS. 3 to 6 schematically illustrate examples of carriers.

The result of step S4 is a generally tube-shaped carrier 6 as depicted in FIG. 2c which shows a ring-like mounting portion 4 and the strips 5 that extend from the mounting portion 4 generally parallel to each other and the central axis $A_4$ of the carrier 6. As is clear from FIG. 2c, the carrier 6c may also be described as generally crown-shaped. The strips 5 of the embodiment shown in FIG. 2c are straight, but this is not necessarily the case in other embodiments because the method may include a step, typically performed before the step S4, in which one or more of the strips 5 are bent, twisted and/or folded in some way in order to have the SSL devices 2 emit light in various directions so that a desired light distribution or suitable design is achieved. For example, the strips 5 may be twisted around their respective lengthwise axis $A_1$. By bending a strip 5 about a transverse axis $A_2$, $A_3$ that is perpendicular to the lengthwise axis $A_1$ of the strip 5, the illumination direction of the SSL devices 2 can be directed up or down to a desired degree. An SSL device 2 can be directed so that it emits light straight up or down by bending a strip 5 90 degrees about a transverse axis $A_2$, $A_3$ for instance. In the example illustrated in FIG. 2c, all of the SSL devices 2 are directed towards the outside 7, i.e. away from the central axis $A_4$, of the carrier 6, but an SSL device 5 may be directed towards the inside 8, i.e. towards the central axis $A_4$, of the carrier 6 by for example bending the strip 5 carrying the SSL device 2 180 degrees about a transverse axis $A_2$, $A_3$. Further, by bending the strips 5 about transverse axes, the portion of a strip 5 where the SSL devices 2 are mounted may be formed into a "V" having one SSL device 2 on each of its two "legs" so that the two SSL devices 5 emit light in slightly different directions. The skilled person realizes that there are many other ways in which the strips 5 can be bent, twisted and/or folded in order to achieve the best light distribution for a particular application. It should be noted that making sure that the portions of the strips 5 where the SSL devices 2 are mounted are substantially flat after the carrier 6 has been given its final shape may minimize mechanical stress on the solder joints and the SSL devices 2.

The method may include a step of forming holes 9 (see for example the carrier 6b in FIG. 4) in the mounting portion 4. Such holes 9 may help reduce the risk of heat damage to the SSL devices during the production of a light bulb. The method may also include a step in which the strips 5 are provided with openings 10 through which electrical wires may pass from one side of the carrier 6 to the other (see the carrier 6b in FIG. 4). These holes 9 and openings 10 are typically made by cutting the substrate 1 before forming the annular mounting portion 4, i.e. prior to the step S4.

FIG. 2d shows a substrate 1 that has been cut in such a way that there are first fastening strips 11a and second fastening strips 11b extending from the mounting portion 4. The first fastening strips 11a extend from the same side of the mounting portion 4 as the strips 5 and between the strips 5. The second fastening strips 11b extend from the opposite side. The first and second fastening strips 11a, 11b may be used to fasten the carrier to the stem of a light bulb, for example by bending the fastening strips 11a, 11b around the stem.

FIGS. 3 to 6 show three examples of carriers which may be produced by the method described above and which are similar to the one in FIG. 2c but with some differences that may make them particularly suitable for a specific application. The carrier 6a in FIG. 3 has a mounting portion 4a that is double-folded. The mounting portion 4a has been folded about itself before formed into an annular shape. As seen along the central axis $A_4$ of the carrier 6a, the mounting portion 4a forms two C's having a common centre and slightly different sizes. As a result, the SSL devices 2 on some of the strips 5a are positioned to emit light towards the inside of the carrier 6a and the SSL devices 2 on some of the strips 5a are positioned to emit light towards the outside of the carrier 6a.

Figure 4:
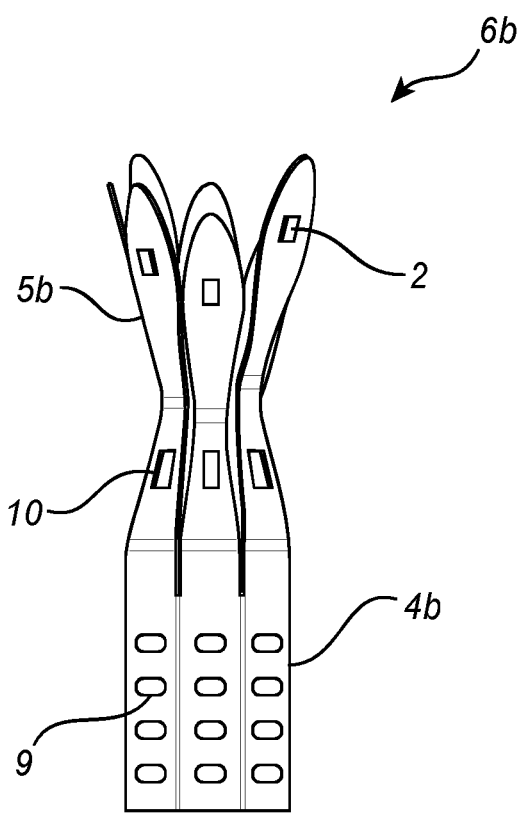

FIG. 4 shows a carrier 6b with a mounting portion 4b that has holes 9. Each strip 5b has a V-like shape when viewed in the tangential direction. The closed end of the V points in the radial direction towards the inside of the carrier 6b. Each strip 5b tapers slightly towards the middle of the strip 5b. The leg of the V that is distal to the mounting portion 4b is slightly wider than the leg that is proximal to the mounting portion 4. The leg of the V that is distal to the mounting portion 4b has a drop-like shape and supports one SSL device 2. The SSL devices 2 are directed slightly downwards in FIG. 4.

Figure 5:
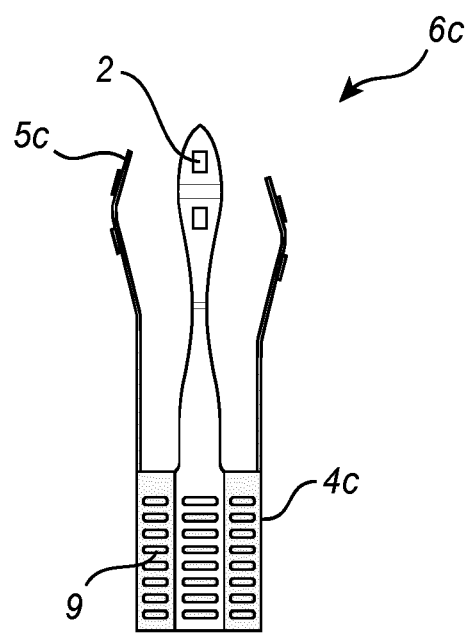

FIG. 5 shows another example of a carrier 6c. The strips 5c have a straight portion, which is proximal to the mounting portion 4c, and a bent portion which is distal to the mounting portion 4c. The bent portion has a substantially V-shaped cross section when viewed in the tangential direction, the closed end of the V pointing in the radial direction towards the outside of the carrier 6c. Each strip 5c has two SSL devices 2, one on each "leg" of the strip's V.

Figure 6:
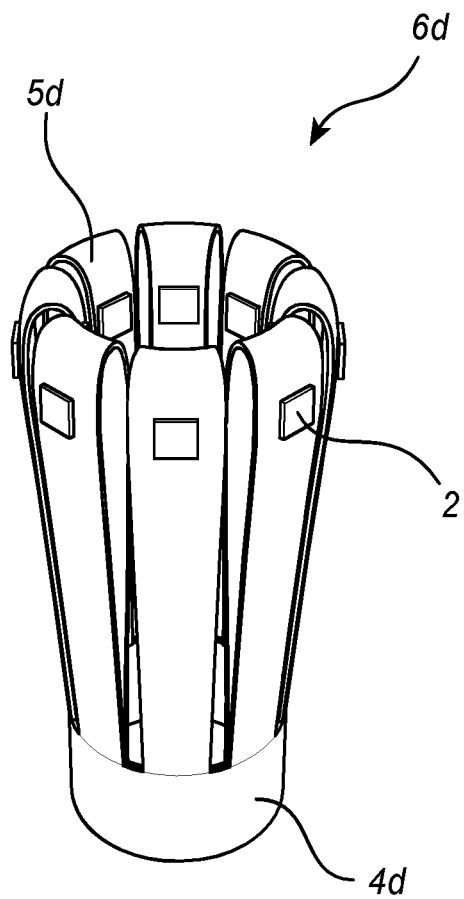

FIG. 6 shows a carrier 6d with double-folded strips 5d. The strips 5d have been folded so that the free end of each strip 5d meets, or almost meets, the mounting portion 4. Each strip 5d has two SSL devices 2. One of the SSL devices 2 is directed towards the outside of the carrier 6d while the other is directed towards the inside.

Figure 7:
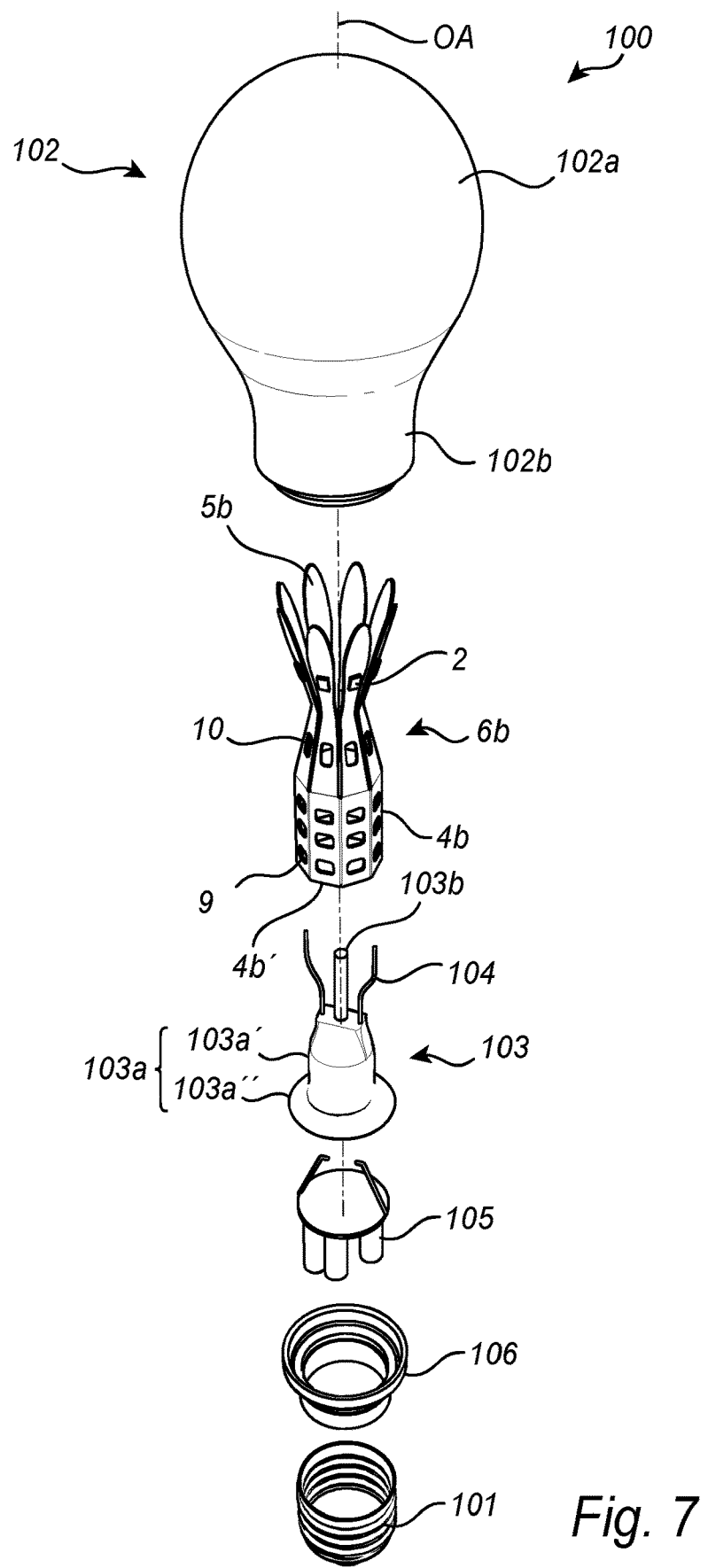
FIG. 7 is a schematic exploded view in perspective of a light bulb.
Figure 8:
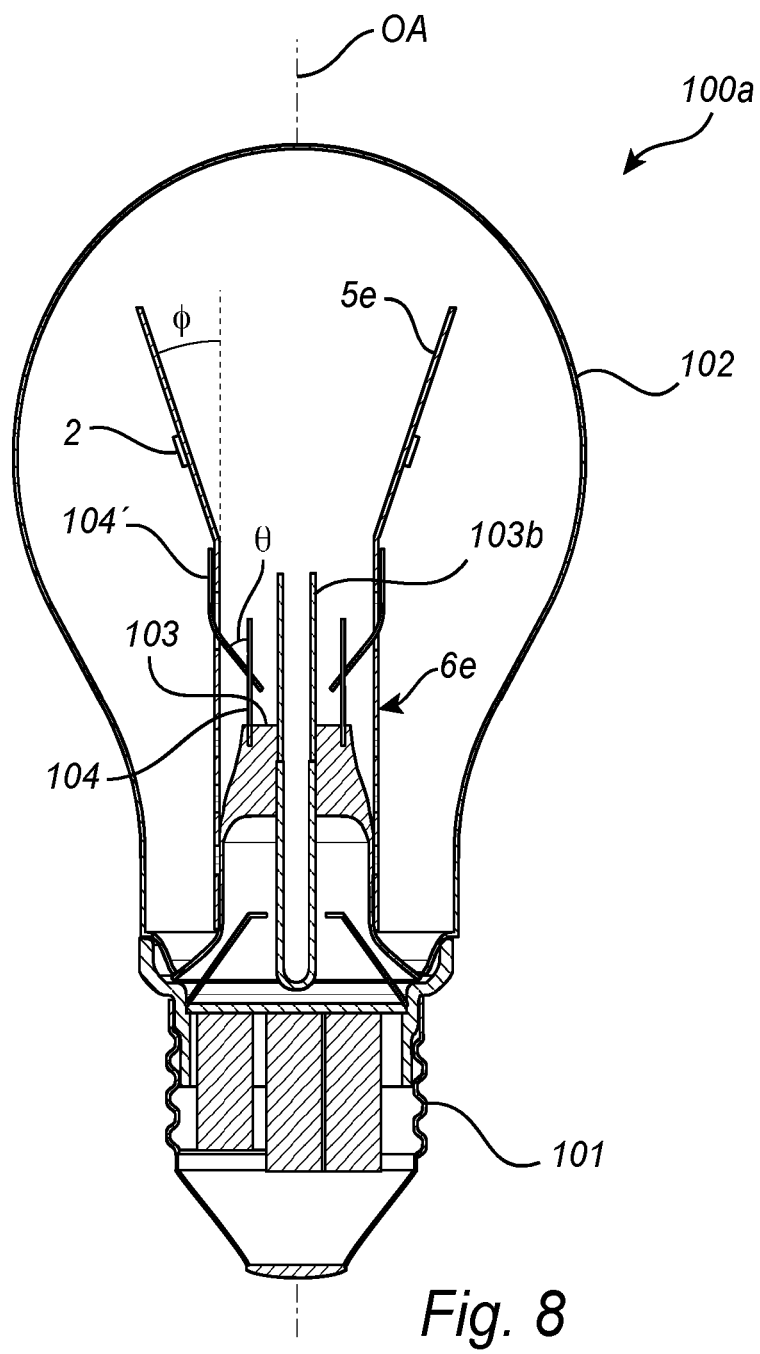
FIG. 8 is a cross-sectional side view of a light bulb.

FIGS. 7 and 8 show examples of light bulbs having carriers produced by the method described above. FIG. 7 shows a light bulb 100 with an optical axis OA which is a central axis of the light bulb. The lighting generated by the light bulb 100 is in this example substantially rotationally symmetric around the optical axis OA. The light bulb 100 has a cap 101 arranged at an end of the light bulb 100, the cap 101 being adapted to mechanically and electrically connect the light bulb 100 to a lamp socket. The cap 101 is typically made of a metal. In this example, the cap 101 is a screw base, but the cap 101 may be of a different type in other embodiments, for example a bayonet light bulb mount.

The light bulb 100 also has a light-transmissive envelope 102 the center of which is displaced along the optical axis OA relative to the cap 101. The envelope 102 can be made of glass or plastics, for instance. In this example, the envelope 102 has a pear-like shape formed by a round head portion 102*a* and a circular cylindrical neck portion 102*b*, the head portion 102*a* and neck portion 102*b* being distal and proximate to the cap 101, respectively. The envelope 102 is filled with a gas so the light bulb 100 is a gas-filled light bulb. The gas may for example be a mix of helium and oxygen. The gas may comprise between 5% and 10% oxygen.

A stem 103, which can be made of for example glass or plastics, is arranged inside the envelope 102. The stem 103 has a base portion 103*a* which is located proximal to the cap 101, approximately in level with the neck portion 102*b* of the envelope 102. The base portion 103*a* includes a cylindrical section 103*a*' and a flared section 103*a*" which are distal and proximal to the cap 101, respectively. The flared section 103*a*" is sometimes referred to as a "flare", and the cylindrical section 103*a*' is sometimes referred to as a "flare tube". The flared section 103*a*" is tapered, becoming wider towards the cap 101. In other examples, the flared section 103*a*" may be substantially flat. The stem 103 also has a tube portion 103*b*, sometimes referred to as an "exhaust tube", through which a gas may be introduced into the envelope 102. The tube portion 103*b* has a smaller diameter than the base portion 103*a* and extends in a direction away from the cap 101 into the envelope 102. The tube portion 103*b* is distal to the cap 101, whereas the base portion 103*a* is proximal to the cap 101. It should be noted that in other embodiments the stem 103 may not have a tube portion 103*b*. There may for example be an opening in an outer surface of the stem 103 through which a gas may be introduced into the envelope 102. The stem 103 comprises contact wires 104, sometimes referred to as "lead in wires", which protrude from the stem 103 into the envelope 102. The contact wires 104 are electrically connected to the cap 101 via a driver 105. An isolation part 106, which electrically isolates some parts of the driver 105 from the cap 101, may be arranged between the driver 105 and the cap 101.

The light bulb 100 has a carrier 6*b* arranged inside the envelope 102. In this example, the carrier 6*b* is similar to the one in FIG. 4. The mounting portion 4*b* of the carrier 6*b* surrounds the stem 103 as seen along the optical axis OA, and the strips 5*b* extend into the envelope 102. An edge 4*b*' of the carrier 6*b*, proximal to the cap, rests on the flared section 103*a*". Differently put, the flared section 103*a*" supports the carrier 6*b* as an abutment. The flared section 103*a*" thereby prevents the carrier 6*b* from moving along the optical axis OA towards the cap 101. The carrier 6*b* is electrically connected to the contact wires 104, for example by soldering or welding. The contact wires 104 help fix the carrier 6*b* mechanically to the stem 103 by preventing the carrier 6*b* from rotating around the stem 103 and slipping off the stem 103 in the direction away from the cap 101 towards the envelope 102. It should be noted that, in other examples, the carrier 6*b* may be fixed to the stem 103 in some other way than the one described above, for example clasping or clamping the cylindrical section 103*a*'. Also, a type of "spider" may be used to mechanically fix the carrier 6*b* to the stem 103.

FIG. 8 shows a light bulb 100*a* which is similar to the one in FIG. 7 except that the crown-shaped carrier 6*e* is different. Each of the strips 5*e* of the carrier 6*e* in FIG. 8 has a first portion, which is proximal to the stem 103 and substantially parallel with the optical axis OA, and a second portion which is distal to the stem 103 and which is inclined by an angle φ with respect to the optical axis OA. The angle φ can for example be about 30 degrees. Further, the carrier 6*e* comprises carrier wires 104' to which the contact wires 104 are connected, for example by means of a clamp or by being welded or soldered together. Each pair of connected contact and carrier wires 104, 104' form an angle θ of less than 45 degrees relative to each other where the wires 104, 104' are connected to each other. The angle θ may be less than 30 degrees, less than 20 degrees or less than 10 degrees.

The light bulb 100*a* is put in operation by plugging the cap 101 into an electrical socket connected to an electricity supply, whereby the driver 105 supplies power to the SSL devices 2 via the contact wires 104 and the carrier 6*e*. The SSL devices 2 emit light that is transmitted through the envelope 102. The heat generated by the SSL devices 2 gives rise to a thermal chimney effect, whereby the gas inside the envelope 102 circulates through and around the carrier 6*e*. The heat dissipated from the SSL devices 2 creates a thermal gradient across the surface of the carrier 6. This results in a circulating gas flow inside the envelope 102, the speed of the gas flow being higher in the center of the envelope 102 than near the envelope 102.

The person skilled in the art realizes that the present invention by no means is limited to the preferred embodiments described above. On the contrary, many modifications and variations are possible within the scope of the appended claims. For example, the shape of the envelope 102 is not limited to a pear-like shape. Some examples of other envelope shapes include cylindrical, ellipsoidal and conical.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A carrier for solid-state lighting devices, intended to be arranged in a light bulb, the carrier comprising:
   an annular mounting portion for mounting the carrier inside the light bulb, the carrier being formed from one single flat and formable substrate bent to a generally tube-shaped form;
   two or more strips extending generally parallel to each other from a proximal portion adjacent to the annular mounting portion to a distal portion at a distance from the annular mounting portion and being separated from each other in a tangential direction of the annular mounting portion, wherein each strip has a length in a direction away from the annular mounting portion and a width in said tangential direction where the strip is joined to the annular mounting portion, said length being at least two times larger than said width, and wherein at least two of the strips have different lengths at said distal portion;
   one or more electrically conducting paths extending along each strip from the annular mounting portion to at least one designated mounting site for a solid-state lighting device, and
   a solid state lighting device mounted in a mounting site, wherein at least one strip has at least two solid state lighting devices mounted thereon, and wherein said at least one strip is folded so that said two solid state lighting devices are configured to radiate in opposite directions.

2. The carrier according to claim 1, wherein said length is at least three times larger than said width, or alternatively at least four times larger, or alternatively at least five times larger.

3. The carrier according to claim 1, wherein at least one strip has a proximal portion adjacent to the annular mounting portion and a distal portion at a distance from the annular mounting portion, and wherein the distal portion is wider than the proximal portion.

4. The carrier according to claim 1, wherein at least one strip has a distal portion at a distance from the mounting portion, which distal portion is bent to form a V shape when viewed in said tangential direction, and wherein one solid state lighting device is mounted on each leg of said V shape.

5. The carrier according to claim 1, wherein the carrier has at least one fastening strip extending from the mounting portion.

6. The carrier according to claim 1, wherein the annular mounting portion comprises a plurality of through holes in the radial direction.

7. A light bulb comprising:
a cap for mechanically and electrically connecting the light bulb to a lamp socket;
a light-transmissive envelope attached to the cap;
a stem arranged inside the envelope and proximal to the cap; and
the carrier according to claim 1, wherein the annular mounting portion at least partly surrounds the stem and the strips extend into the envelope, and wherein two or more solid-state lighting devices are mounted on the carrier.

8. The light bulb according to claim 1, wherein the light bulb is a gas-filled light bulb.

9. A method for producing a carrier for solid-state lighting devices, the carrier being arranged in a light bulb, the method comprising:
providing a flat formable substrate;
mounting two or more solid-state lighting devices on the substrate;
cutting the substrate into a shape having a substantially rectangular mounting portion and two or more strips supporting the solid-state lighting devices, the strips extending generally parallel to each other from a proximal portion adjacent to one side of the mounting portion in a direction away from the mounting portion to a distal portion at a distance from the mounting portion and being separated from each other in a lengthwise direction of the mounting portion, each strip having a length in the direction away from the mounting portion and a width in the lengthwise direction where the strip is joined to the mounting portion, said length being least two times larger than said width, and wherein at least two of the strips have different lengths at said distal portion; and
forming the mounting portion into an annular shape, to form a generally tube-shaped carrier,
wherein at least one strip has at least two solid state lighting devices mounted thereon, and wherein said at least one strip is folded so that said two solid state lighting devices are configured to radiate in opposite directions.

10. The method according to claim 9 further comprising inserting the carrier into a light bulb.

11. The method according to claim 9, wherein at least one strip has a distal portion at a distance from the mounting portion, which distal portion is bent to form a V shape when viewed in said tangential direction, and wherein one solid state lighting device is mounted on each leg of said V shape.

12. The method according to claim 9, further comprising forming a plurality of holes in the mounting portion.

13. The carrier according to claim 9, wherein for each strip, the distal portion is wider than the proximal portion.

14. A carrier for solid-state lighting devices, the carrier comprising:
an annular mounting portion for mounting the carrier inside the light bulb, the carrier being formed from one single flat and formable substrate bent to a generally tube-shaped form;
two or more strips extending generally parallel to each other from a proximal portion adjacent to the annular mounting portion to a distal portion at a distance from the annular mounting portion and being separated from each other in a tangential direction of the annular mounting portion, wherein each strip has a length in a direction away from the annular mounting portion and a width in said tangential direction where the strip is joined to the annular mounting portion, one or more electrically conducting paths extending along each strip from the annular mounting portion to at least one designated mounting site for a solid-state lighting device, and
a solid state lighting device mounted in a mounting site, wherein at least one strip has at least two solid state lighting devices mounted thereon, and wherein said at least one strip is folded so that said two solid state lighting devices are configured to radiate in opposite directions.

15. The carrier according to claim 14, wherein said length is at least two times larger than said width.

16. The carrier according to claim 14, wherein at least two of the strips have different lengths at said distal portion.

17. The carrier according to claim 14, wherein for each strip, the distal portion is wider than the proximal portion.

18. The carrier according to claim 14, wherein the annular mounting portion at least partially surrounds a stem, wherein the stem is positioned inside the light bulb, wherein the carrier has at least one fastening strip extending from the mounting portion to fasten the carrier to the stem.

19. The carrier according to claim 14, wherein at least one strip has a distal portion at a distance from the annular mounting portion, which distal portion is bent to form a V shape when viewed in said tangential direction, and wherein one solid state lighting device is mounted on each leg of said V shape.

20. The carrier according to claim 14, wherein the annular mounting portion comprises a plurality of holes.

* * * * *